United States Patent
Rautiainen et al.

(10) Patent No.: US 6,859,025 B2
(45) Date of Patent: Feb. 22, 2005

(54) MEASUREMENT OF QUANTITIES OF ELECTRIC LINE

(75) Inventors: Kari Rautiainen, Vaasa (FI); Kimmo Kauhaniemi, Vaasa (FI); Olavi Vähämäki, Laihia (FI)

(73) Assignee: ABB Technology AG, Zurich (CH)

( * ) Notice: Subject to any disclaimer, the term of this patent is extended or adjusted under 35 U.S.C. 154(b) by 0 days.

(21) Appl. No.: 10/232,403

(22) Filed: Sep. 3, 2002

(65) Prior Publication Data

US 2003/0030428 A1 Feb. 13, 2003

Related U.S. Application Data

(63) Continuation of application No. PCT/FI01/00277, filed on Mar. 20, 2001.

(30) Foreign Application Priority Data

Mar. 21, 2000 (FI) .............................................. 20000665

(51) Int. Cl.[7] ........................ G01R 23/12; G01R 25/00; G01R 31/08
(52) U.S. Cl. ..................... 324/76.52; 324/86; 324/521; 324/522
(58) Field of Search .............................. 324/76.52, 86, 324/521, 522, 539

(56) References Cited

U.S. PATENT DOCUMENTS

| | | | |
|---|---|---|---|
| 3,699,431 A | 10/1972 | Paddison et al. ............. 324/51 |
| 4,758,962 A | 7/1988 | Fernandes ................... 364/483 |
| 5,214,373 A | * 5/1993 | Nara et al. ................... 324/107 |
| 5,438,256 A | 8/1995 | Thuries et al. .............. 324/117 |
| 5,565,783 A | 10/1996 | Lau et al. .................... 324/522 |
| 5,946,174 A | 8/1999 | Kaiser ......................... 361/467 |
| 6,141,626 A | * 10/2000 | Holdsclaw et al. ........... 702/60 |
| 6,392,390 B1 | * 5/2002 | Ito et al. ...................... 323/209 |
| 6,642,700 B2 | * 11/2003 | Slade et al. ................... 324/66 |

FOREIGN PATENT DOCUMENTS

NO        303749 B1      8/1998

* cited by examiner

Primary Examiner—N. Le
Assistant Examiner—John Teresinski
(74) Attorney, Agent, or Firm—Oliff & Berridge, PLC

(57) ABSTRACT

A method and apparatus for measuring quantities of a multi-phase electric line, the apparatus comprising a control unit and a measurement unit in connection with each phase conductor of the electric line, wherein each measurement unit is arranged to measure a first phase quantity of the phase conductor in connection with which it is located and to transfer the measured quantity value to the control unit, the measurement unit located in connection with one phase conductor being further arranged to measure phase angles between the first phase quantity of said phase conductor and first phase quantities of other phase conductors and to transfer the measured phase angle values to the control unit.

20 Claims, 3 Drawing Sheets

MEASUREMENT OF QUANTITIES OF ELECTRIC LINE

BACKGROUND OF THE INVENTION

This application is a Continuation of International Application PCT/FI01/00277 filed Mar. 20, 2001 which designated the U.S. and was published under PCT Article 21(2) in English.

The invention relates to measuring quantities of an electric line.

In connection with reliable transfer and distribution of electric energy, it is important that the quality of the energy to be transferred can be monitored in a reliable manner. Therefore, quantities of transmission and distribution lines, such as voltages and currents, are measured, which enables e.g. possible failures to be detected and located. A known way to measure the quantities of an electric wire is to arrange measurement units in connection with the phase conductors of an electric line to measure e.g. the current and voltage of the conductors and to transmit, e.g. over a radio path, measurement information to a control unit, which further interprets the measurement information and possibly forwards it. Such measurement arrangements are disclosed e.g. in patent publication U.S. Pat. No. 5,565,783 and published application EP 0 314 850.

When e.g. the summation current of the phases of an electric line, i.e. a zero current, in a multi-phase system is to be determined using phase-conductor-specific phase currents, not only the magnitude of each phase current but also the phase angle, i.e. the phase current phasors, of each phase current have to be known, which enables the phasor of the zero current to be obtained by adding up the phase current phasors. In the prior art measurement arrangements, measurements to be carried out in measurement units of different phases are usually synchronized with each other such that the control unit is able to place the measurement signals of a particular quantity supplied from different measurement units on the same time axis, which enables the phase angles between the phase-specific values of the quantity to be determined by comparing the measurement signals. The measurements can be synchronized e.g. by attaching, at a measurement unit, a time stamp to each measurement result to indicate the point in time at which the measurement was carried out. Another alternative is to control the measurements from the control unit such that the control unit informs the measurement unit about the time of measurement.

The problem with the arrangement described above is that in order to synchronize the measurements, the measurement units must, one way or another, be synchronized with each other and the measurements must be performed simultaneously, which makes the measurement system more complicated to implement. Furthermore, if the measurements are controlled e.g. from the measurement unit and the data transmission between the control unit and the measurement units is based on a radio connection, the radio connection has to be a bidirectional one, which means that the measurement units are thus also provided with receiver equipment.

BRIEF DESCRIPTION OF THE INVENTION

An object of the invention is thus to provide a method and an apparatus for implementing the method so as to enable the above-mentioned problems to be solved. The object of the invention is achieved by a method and a system, which are characterized by what has been disclosed in independent claims 1, 8 and 15. Preferred embodiments of the invention are disclosed in the dependent claims.

The invention is based on measuring, using a measurement unit in connection with one phase conductor, phase angles between a certain phase quantity, e.g. a phase current, of the particular phase conductor and corresponding phase quantities other phase conductors, which, in a stable situation, enables phase-specific phasors of the phase quantity to be formed on the basis of these phase angles and phase quantity values measured phase-specifically.

An advantage of the method and system of the invention is that the measurements to be carried out phase-specifically do not have to be performed simultaneously or synchronized with each other.

BRIEF DESCRIPTION OF THE DRAWINGS

The invention is now described in closer detail in connection with the preferred embodiments and with reference to the accompanying drawings, in which.

DETAILED DESCRIPTION OF THE INVENTION

Figure 1:
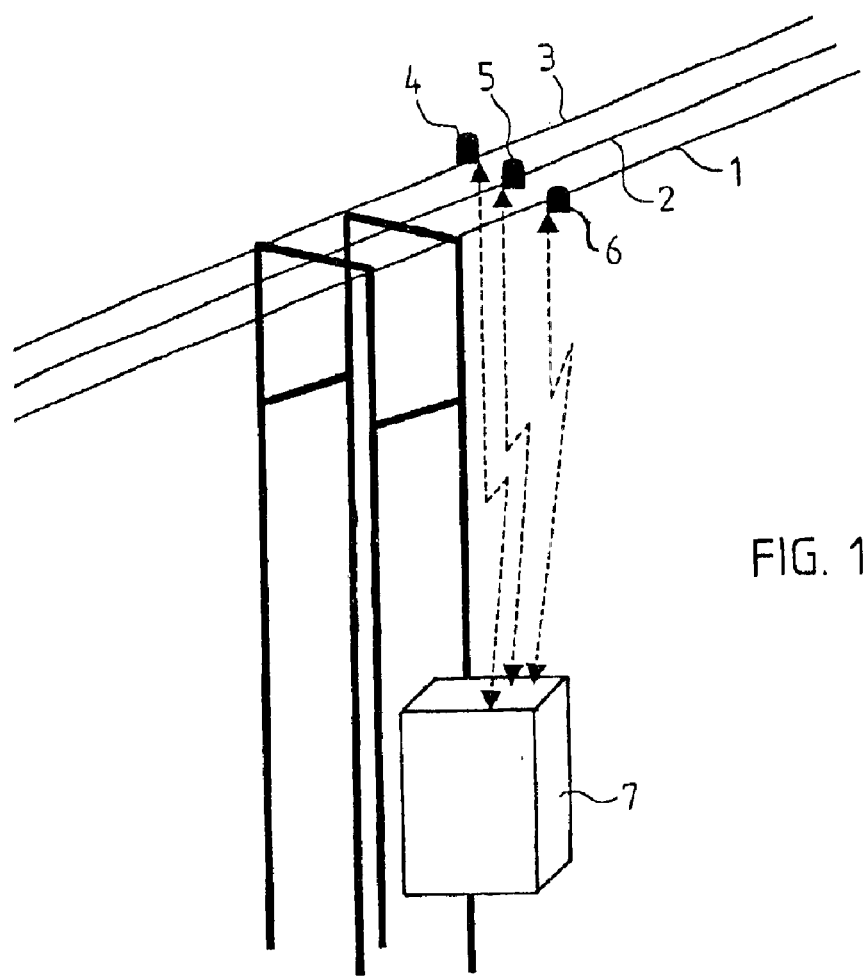
FIG. 1 shows how measurement units and a control unit are placed in an electric line according to an embodiment.

FIG. 1 illustrates a measurement arrangement of the invention according to an embodiment thereof. Measurement units 4, 5 and 6 are installed in phase conductors 1, 2 and 3 of an electric line in a three-phase system. The measurement units 4, 5 and 6 transmit measured quantities to a separately located control unit 7 e.g. over a radio path. The control unit 7 may also be located in connection with any one of the measurement units 4, 5 or 6. Furthermore, the control unit 7 can be e.g. a portable unit to be used for carrying out occasional measurements. The control unit 7 analyses and combines measurement results and reports the information further e.g. to a supervisory control and data acquisition SCADA system. The arrangement can also be applied to other types of electric line than the overhead line shown in the figure. Neither is the invention restricted to any particular voltage level either.

The measurement units 4, 5 and 6 can be attached to the phase conductors 1, 2 and 3, or they can be attached in some other way in the vicinity of the phase conductors. The attachment should be able to keep the measurement unit 4, 5, 6 in a given position and at a given distance from the phase conductor 1, 2, 3. The power feed of the measurement units 4, 5 and 6 can be arranged in a known manner, e.g. by using a battery, or inductively from a phase conductor by means of a special coil to produce the necessary power for the measurement unit by a magnetic field caused by the current flowing in the phase conductor 1, 2, 3, the magnetic field causing a voltage into the coil, or capacitively from the phase conductor. The measurement units 4, 5 and 6 further comprise means for transmitting measurement information to the control unit 7; for example, when a radio connection is used, a radio transmitter, and the control unit a radio receiver, correspondingly. The measurement units 4, 5 and 6 can measure one or more quantities of the electric line. Typically, they measure at least the phase current and phase voltage from the phase conductors 1, 2 and 3 attached thereto. The measurement units 4, 5 and 6 can measure the phase current using e.g. one or more measurement coils or other such measurement elements, such as a Hall probe, which, because of the magnetic field caused by the phase current flowing in the phase conductor 1, 2 and 3, produce a signal proportional to the phase current, as is well known. Similarly, the phase voltage can be measured using e.g. a capacitive coupling, as is also well known. The measurement unit 4, 5, 6 can carry out measurements incessantly or e.g. at certain intervals. The step of taking measurements is continued until the peak value (or e.g. a root-mean-square value) of a quantity being measured is established; e.g. in a 50/60 Hz system, typically at least 10 ms. The manner in which each measurement unit 4, 5 and 6 measures the phase current and/or phase voltage from the phase conductor 1, 2 and 3 it is in connection with is, however, irrelevant to the basic idea of the invention.

Figure 2:
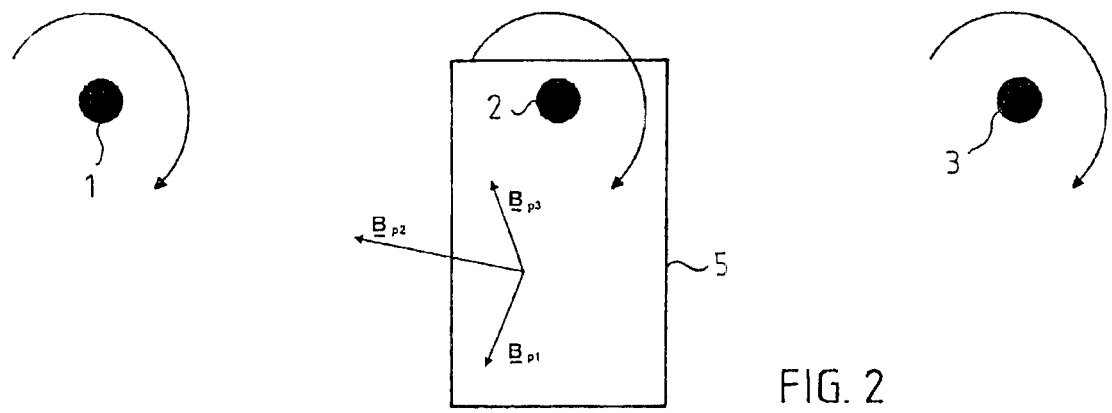
FIG. 2 shows the direction of magnetic fields caused by phase currents flowing in phase conductors.

According to the invention, the phase angle between a phase quantity of the phase conductor 1, 2 or 3 attached to a particular measurement unit and a corresponding phase quantity of other phase conductors is measured by one measurement unit 4, 5 or 6. According to a preferred embodiment of the invention, the phase quantity is the phase current. FIG. 2 shows the phase conductors 1, 2 and 3 in cross-section as seen from the direction of travel thereof. The curved arrows drawn partly around the phase conductors 1, 2 and 3 describe the direction of the magnetic fields caused by the phase currents flowing in the conductors. The figure further shows a measurement unit 5 attached to the middle phase conductor 2. Furthermore, by way of example, the figure illustrates phasors $B_{p1}$ (phase 1), $B_{p2}$ (phase 2) and $B_{p3}$ (phase 3) describing the direction and magnitude (assuming that the phase currents are equal in magnitude) of the magnetic field caused by the phase current flowing in each phase conductor 1, 2 and 3 at point A of the measurement unit 5. If the conductors 1, 2 and 3 are located with respect to each other as shown in FIG. 2, the phase angles between the phase currents of the different phases 1, 2 and 3 are preferably measured using the measurement unit 5 of the middle phase conductor 2 because it is located nearest to the adjacent phase conductors 1 and 3 and thus capable of determining the phase angles most accurately.

Figure 3:
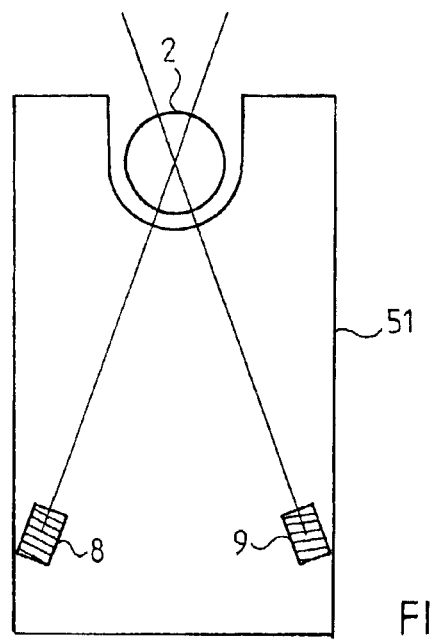
FIG. 3 shows how coils for measuring phase currents of neighbouring phases are placed according to an embodiment.
Figure 4:
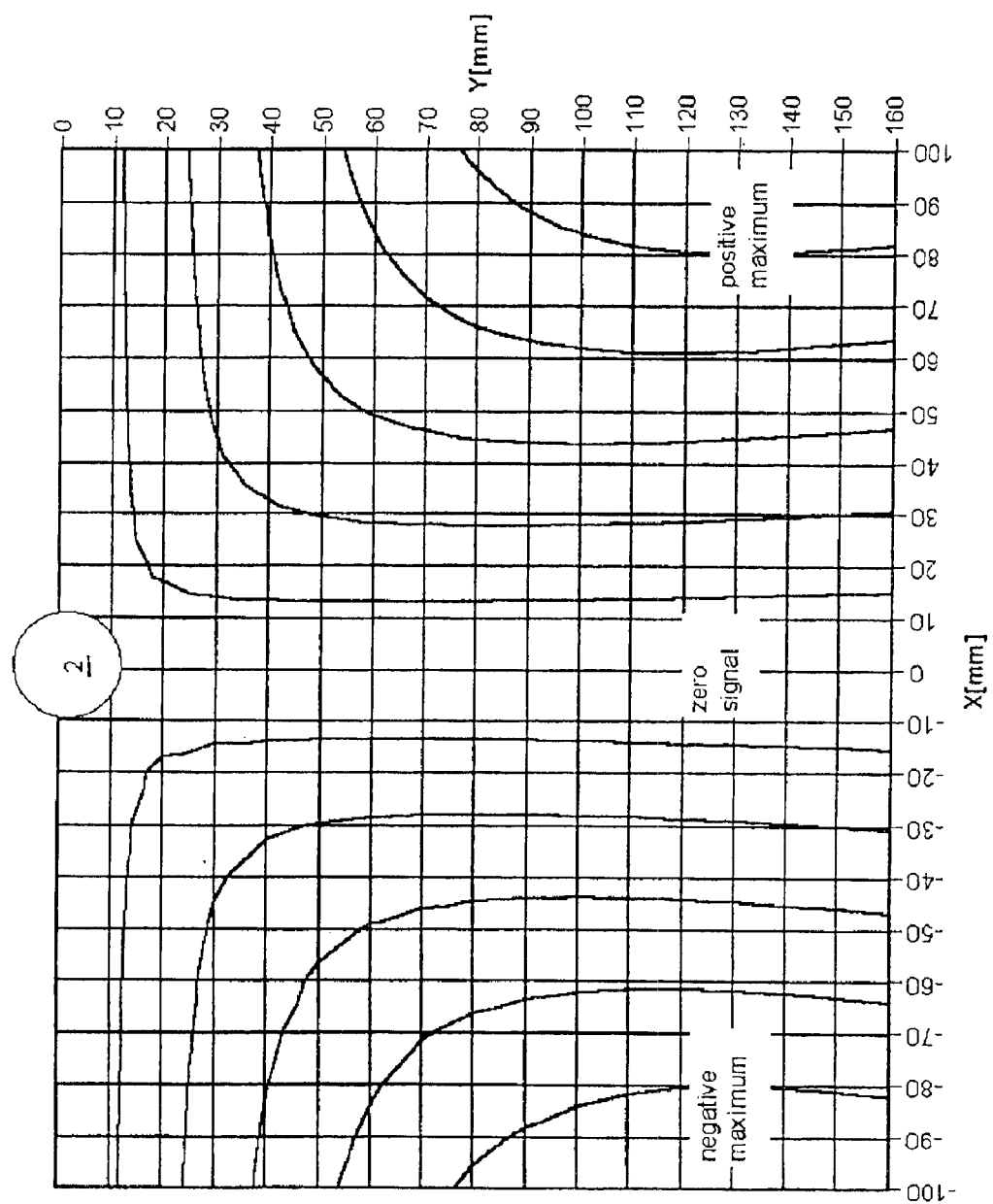
FIG. 4 shows the difference of the magnetic fields of outermost phase conductors in the vicinity of a middle phase conductor.

In order to enable the phase angle between the phase current of the middle phase 2 and the phase currents of the other phases 1 and 3 to be determined using the measurement unit 5 of the middle phase, it has to be able to measure the phase currents of the outermost phases 1 and 3 at least at an accuracy enabling e.g. a cycle or a half cycle of a current to be separated e.g. on the basis of zero crossings of the value of the current, whereby they can be compared to the phase current of the middle phase 2, thus enabling the phase angles between the currents to be determined on the basis of the difference between the timing of the cycles of the currents. In e.g. a system having a nominal frequency of 50 Hz (cycle length 20 ms), the phase angle between two currents is 120° if the difference of the starting times of their cycle is 20/3 ms, one cycle corresponding to 360°. The necessary length of a measurement period is thus e.g. the time during which the current of each phase e.g. once crosses zero; the phase angles between the currents can be determined by comparing the points in time at which the crossings took place. The measurement unit 5 of the middle phase 2 does not necessarily have to be able to measure the absolute values, e.g. the peak value or the root-mean-square value, of the phase currents of the outermost phases 1 and 3 accurately since these values are preferably obtained from the measurement units 4 and 6 in connection with the phases in question. When e.g. the current of the phase 3 is measured on the basis of the magnetic field caused by this phase, the effect of the magnetic fields caused by the currents of the phases 1 and 2 has to be eliminated. FIG. 3 shows a possible placement of coils 8 and 9 for measuring the currents of the phases 1 and 3 on a base 51 contained in the measurement unit 5 of the middle phase 2, the base being e.g. a printed board. The placement of the coils 8 and 9 shown is obtained in the following manner: first, by placing the coils 8 and 9 such that their axis passes through the centre of the phase conductor 2, the effect of the magnetic field $B_{p2}$ caused by the current of the phase conductor 2 can be eliminated completely since the magnetic field is then perpendicularly located with respect to the axis of the coils 8 and 9, thus not causing any voltage to the coils 8 and 9. The voltage induced to the coils 8 and 9 is thus caused by the magnetic fields $B_{p1}$ and $B_{p3}$ of the currents of the phases 1 and 3 only. In the example shown, the area of the base 51 on which the coils 8 and 9 can be placed is 160 mm high and 80 mm wide. FIG. 4 shows the signal level in the coil caused by the difference Bp3−Bp1 of the magnetic fields of the currents of the outermost phases 1 and 3 on the basis of the location of the coil in the vicinity of the phase conductor 2. The placement of the phase conductors 1, 2 and 3 is assumed to be in accordance with that in FIG. 2, which means that they are located in the same plane, the distance from the phase conductors 1 and 3 to the phase conductor 2 being 500 mm. The signal level minimum (negative maximum) is shown at the bottom left corner of FIG. 4 and the signal level maximum (positive maximum) is shown at the bottom right corner. In the middle area the magnetic fields cancel each other out (zero signal). The lines drawn in the figure illustrate how signal levels change when the location of the coil changes. If the area of the base 51 on which the coils 8 and 9 can be located is thus 160 mm high and 80 mm wide and the base is placed in connection with the phase conductor 2, in the grid of FIG. 4 it covers area: X=−40 . . . 40 and Y=0 . . . 160. Thus, when the current of phase 3 is to be measured, the coil 9 measuring the current is, within the scope of the base 51, preferably located approximately at point X=40 and Y=110 since according to FIG. 4, this point gives a maximum signal for difference Bp3−Bp1. Since the current of the phase conductor 1 also induces a voltage to the coil 9, a second coil 8 is also necessary, which is preferably located horizontally symmetrically with the coil 9, i.e. at point X=−40 and Y=110 (which, correspondingly, gives a maximum signal for difference Bp1−Bp3). The following table shows voltages induced to the coils 8 and 9 caused by the currents of the phases 1 and 3 when the placement is as described (the values are exemplary ones and they depend on the structure of the coil) and when the phase currents are 80 A and the nominal frequency 50 Hz:

| Signal | Signal level [mV] | Coil | Source |
| --- | --- | --- | --- |
| $U_{11}$ | 2.07 | 8 | phase 1 |
| $U_{13}$ | 1.52 | 8 | phase 3 |
| $U_{21}$ | 1.52 | 9 | phase 1 |
| $U_{23}$ | 2.07 | 9 | phase 3 |

The current of the phase 3 causes the maximum signal to the coil 9, the ratio of the voltage caused to the coil 9 by the current of phase 3 to the voltage caused by the current of the phase 1 being $k=U_{23}/U_{21}\approx1.4$. Similarly, the current of the phase 1 causes the maximum signal to the coil 8, the ratio of the voltage caused to the coil 8 by the current of the phase 1 to the voltage caused by the current of the phase 3 being $U_{11}/U_{13}\approx1.4=k$. If signal ($U_{c1}=U_{11}+U_{13}$) of the coil 8 is divided by coefficient k and subtracted from signal ($U_{c2}=U_{23}+U_{21}$) of the coil 9, the signal caused by the current of the phase 1 is eliminated and signal ($U_{p3}$) will remain, caused by the current of the phase 3 only.

In a similar manner, by dividing signal ($U_{c2}$) of the coil 9 by coefficient k and by subtracting the result from signal ($U_{c1}$) of the coil 8, the signal caused by the current of the phase 3 is eliminated and signal ($U_{p1}$) will remain, caused by the current of the phase 1 only.

The value of voltage ratio k depends on the mutual placement of the phase conductors 1, 2 and 3 and the distance of the same from each other. Consequently, it is preferable to predetermine the values of k necessary e.g. for different conductor spacings, in which case a single unit of measurement can easily be used in connection with electric lines having different conductor spacings by using a value of k suitable at a given time. It is to be noted that the values presented in the above examination have been disclosed only by way of example to illustrate the application of the invention, and they may vary according to the characteristic features of the system to which the invention is applied. It is obvious that instead of the coils 8 and 9, elements of another type can also be used for indicating the strength of a magnetic field dependently on the direction of the magnetic field, such as Hall probes to be placed such that they do not indicate the strength of the magnetic field caused by the current of the phase conductor in the connection of which the measurement unit 5 is located.

Figure 5:
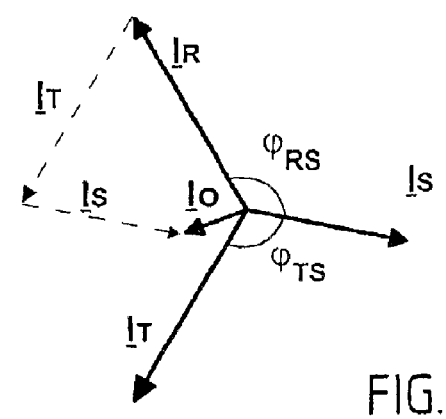
FIG. 5 shows a phasor diagram of current quantities of the electric line.

The signals describing the currents of the phases 1 and 3 enable the phase angles (($\phi_{RS}$ and $\phi_{TS}$) between the current of the phase 2 and the currents of the phases 1 and 3 to be determined, as disclosed above. After the phase angles have been measured at the measurement unit 5, they are transmitted to the control unit 7. The control unit 7 also receives from all measurement units 4, 5 and 6 values $I_R$ (phase 1), $I_S$ (phase 2) and $I_T$ (phase 3) of the currents of the phases 1, 2 and 3 corresponding to the measurement units. A value of a current is a value describing the amplitude of a current signal, e.g. a peak value or a root-mean-square value. In a stable situation, the phase currents need not be measured simultaneously at the different measurement units 4, 5 and 6 since the middle measurement unit 5 measures the phase angles between the phase currents. On the basis of this information, the control unit 7 is able to produce phase current phasors $I_R$, $I_S$ and $I_T$, which are shown in FIG. 5. As is well known, the lengths of the phasors describe the value of the current, and the directions of the phasors with respect to each other can be determined on the basis of the phase angle $\phi_{RS}$ between the currents of the phases 2 and 1 and the phase angle $\phi_{TS}$ between the currents of the phases 2 and 3, as shown by FIG. 5. The figure further shows how adding up phasors $I_R$, $I_S$ and $I_T$ of the phase currents gives phasor $I_0$ of zero $I_0$. The zero current can be used e.g. for indicating failures; the location of an earth fault, for example, can be inferred from the phase angle differences between zero current phasors which differ from each other at sensors located before and after a faulty point. It is also feasible to use only one measurement unit 5 to measure the phase angles between the phase currents, as described above, which enables a failure to be detected when the phase angles differ from their usual values. The measurement unit 5 may also measure the values of the phase currents of all phases 1, 2 and 3, in which case the zero current phasor can be produced on the basis of the measurements of this one measurement unit 5.

According to a preferred embodiment of the invention, each measurement unit 4, 5 and 6 also measures the voltage of its own phase and the phase angle between the phase current and the phase voltage, and transmits them to the control unit 7. On the basis of these values and the current phasors already provided, it is possible to produce the phase voltage phasors and the sum phasor thereof, i.e. the zero voltage phasor. Also the zero voltage can be used e.g. for detecting failures. By comparing the phase angles of the zero voltage and the zero current phasors, e.g. the direction of the failure can be inferred in a similar manner to that carried out in earth fault relays. Being obvious to one skilled in the art, the utilization of zero current and zero voltage e.g. in failure detection is not, however, discussed in closer detail herein.

It is obvious to one skilled in the art that as technology advances, the basic idea of the invention can be implemented in many different ways. The invention and its embodiments are thus not restricted to the examples described above but they can vary within the scope of the claims.

What is claimed is:

1. A method for measuring quantities of a multi-phase electric line by means of a measurement arrangement comprising a separate measurement unit in connection with each phase conductor of the electric line and a control unit, the method comprising:

measuring a first phase quantity of each phase conductor by means of the respective measurement unit in connection with the phase conductor;

transferring the measured quantity values to the control unit;

measuring, by means of the measurement unit in connection with one phase conductor, phase angles between a first phase quantity of said phase conductor in question and first phase quantities of other phase conductors; and transferring the measured phase angle values to the control unit.

2. The method of claim 1, wherein the method further comprises:

determining, at the control unit, a phasor of the first phase quantity of each phase conductor on the basis of the measured quantity values and phase angle values.

3. The method of claim 2, wherein the method further comprises:

determining, at the control unit, a phasor of a sum quantity of the first phase quantity on the basis of the determined phase-conductor-specific phasors of the first phase quantity.

4. The method of claim 1, wherein the method further comprises:

measuring a second phase quantity of each phase conductor by means of the measurement unit in connection with said phase conductor;

measuring a phase angle between the first phase quantity and the second phase quantity of each phase conductor by means of the measurement unit in connection with said phase conductor; and transferring the measured quantity values and phase angle values to the control unit.

5. The method of claim 4, wherein the method further comprises:

determining, at the control unit, a phasor of the second phase quantity of each phase conductor on the basis of the measured phase angle values between the first phase quantities, the phase-specific quantity values of the second phase quantity and the phase angle values between the first and the second phase quantities; and determining, at the control unit, a phasor of a sum quantity of the second phase quantity on the basis of the determined phase-conductor-specific phasors of the second phase quantity.

6. The method of claim 4, wherein the second phase quantity is a phase voltage.

7. The method of claim 1, wherein the first phase quantity is a phase current.

8. The method of claim 1, wherein the measured quantity values and the measured phase angle are transferred to the control unit based on a bi-directional wireless connection.

9. An apparatus for measuring quantities of a multi-phase electric line, the apparatus comprising:

a control unit; and a separate measurement unit in connection with each phase conductor of the electric line, each measurement unit being arranged to measure a first phase quantity of the respective phase conductor in connection with which it is located and to transfer the measured quantity value to the control unit, whereby the measurement unit located in connection with one phase conductor is further arranged to measure phase angles between the first phase quantity of said phase conductor in question and first phase quantities of other phase conductors and to transfer the measured phase angle values to the control unit.

10. The apparatus of claim 9, wherein the control unit is arranged to determine a phasor of the first phase quantity of each phase conductor on the basis of the measured quantity values and phase angle values.

11. The apparatus of claim 10, wherein the control unit is further arranged to determine a phasor of a sum quantity of the first phase quantity on the basis of the determined phase-conductor-specific phasors of the first phase quantity.

12. The apparatus of claim 9, wherein each measurement unit is arranged to measure a second phase quantity of the phase conductor in connection with which it is located, and a phase angle between the first phase quantity and the second phase quantity, and to transfer the measured quantity values and phase angle values to the control unit.

13. The apparatus of claim 12, wherein the control unit is further arranged to determine a phasor of the second phase quantity of each phase conductor on the basis of the measured phase angle values between the first phase quantities, the phase-conductor-specific quantity values of the second phase quantity and the phase angle values between the first and the second phase quantities, and a phasor of a sum quantity of the second phase quantity on the basis of the determined phase-conductor-specific phasors of the second phase quantity.

14. The apparatus of claim 12, wherein the second phase quantity is a phase voltage.

15. The apparatus of claim 9, wherein the first phase quantity is a phase current.

16. A measuring system for measuring quantities of a multi-purpose electric line, comprising:

a separate measurement unit in connection with each phase conductor of the multi-phase electric line, each measurement unit being arranged to measure a first phase quantity of the respective phase conductor in connection with which it is located and to send the measured quantity value to a control unit, whereby the measurement unit located in connection with one phase conductor is further arranged to measure phase angles between the first phase quantity of said phase conductor in question and first phase quantities of other phase conductors and to send the measured phase angle values to the control unit.

17. The measuring system of claim 16, wherein each measurement unit is further arranged to measure a second phase quantity of the respective phase conductor in connection with which it is located, and a phase angle between the first phase quantity and the second phase quantity, and to send the measured quantity values and phase angle values to the control unit.

18. The measuring system of claim 16, wherein the first phase quantity is a phase current.

19. The measuring system of claim 18, wherein at least one of the measurement units comprises at least one element, such as a coil or a Hall probe, to indicate the strength of a magnetic field dependently on the direction of the magnetic field, the element being located such that it does not substantially indicate the strength of the magnetic field caused by the current of the phase conductor in connection with which the measurement unit is located.

20. The measuring system of claim 19, wherein said element indicating the strength of the magnetic field is a coil located such that its axis is perpendicular with respect to the direction of the magnetic field caused by the current of the phase conductor in the connection with which the measurement unit is located.

* * * * *

UNITED STATES PATENT AND TRADEMARK OFFICE
CERTIFICATE OF CORRECTION

PATENT NO.    : 6,859,025 B2
DATED         : February 22, 2005
INVENTOR(S)   : Kari Rautiainen, Kimmo Kauhamiemi and Olavi Vähämäki It is certified that error appears in the above-identified patent and that said Letters Patent is hereby corrected as shown below:

Column 8,
Line 13, please replace "multi-purpose" with -- multi-phase --.

Signed and Sealed this

Thirty-first Day of May, 2005

JON W. DUDAS
*Director of the United States Patent and Trademark Office*